(12) United States Patent
Yan

(10) Patent No.: US 6,998,203 B2
(45) Date of Patent: *Feb. 14, 2006

(54) PROXIMITY CORRECTING LITHOGRAPHY MASK BLANKS

(75) Inventor: Pei-Yang Yan, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 169 days.

This patent is subject to a terminal disclaimer.

(21) Appl. No.: 10/633,211

(22) Filed: Aug. 1, 2003

(65) Prior Publication Data

US 2005/0026048 A1   Feb. 3, 2005

(51) Int. Cl.
 *G03F 9/00*   (2006.01)
 *G03C 5/00*   (2006.01)

(52) U.S. Cl. ............................. 430/5; 430/30; 430/330
(58) Field of Classification Search .................. 430/5, 430/30, 330

See application file for complete search history.

(56) References Cited

U.S. PATENT DOCUMENTS 5,503,950 A * 4/1996 Miyake et al. .................. 430/5
6,756,158 B2 * 6/2004 Yan ................................ 430/5

* cited by examiner

*Primary Examiner*—Saleha R. Mohamedulla
(74) *Attorney, Agent, or Firm*—Trop, Pruner & Hu, P.C.

(57) ABSTRACT

An extreme ultraviolet lithography mask may be heated locally to change its reflectivity and to adjust for proximity and other optical disturbances. The localized heating may result in the formation of silicide at the molybdenum silicon interface in the multilayer stack that makes up the extreme ultraviolet lithography mask.

12 Claims, 2 Drawing Sheets

PROXIMITY CORRECTING LITHOGRAPHY MASK BLANKS

BACKGROUND

This invention relates generally to lithography.

In extreme ultraviolet lithography, a multilayer mask blank exhibits localized reflectivity to define features which may be transferred from the mask to a semiconductor wafer in repeatable fashion. The use of extreme ultraviolet lithography enables relatively smaller feature sizes to be transferred.

Mask aerial images may be subject to the so-called proximity effect associated with the limitations of the exposure projection lens. The proximity effect is an optical effect that causes features at different pitches to be printed at different critical dimensions for the same exposure dose. The distortion of the mask image may also include line end shorting, due to the resolution limit of the projection lens.

Proximity correction and mask pattern distortion correction may be accomplished by modifying the mask design. For example, in order to adjust the pitch dependent feature's critical dimension, lines on the mask may be designed either larger or smaller than the size desired to be transferred, to compensate for the proximity effect. In the case of line end shorting, additional chromium absorber may be added to that end. These modifications, in many cases, push the mask fabrication to its limit. The problems include not only a huge amount of data handling, but also the resolution limitation in mask patterning due to small correction features, very long inspection time, and possible data confusion.

Thus, there is a need for a better way to correct the proximity effect in extreme ultraviolet lithography masks.

DETAILED DESCRIPTION

Figure 1:
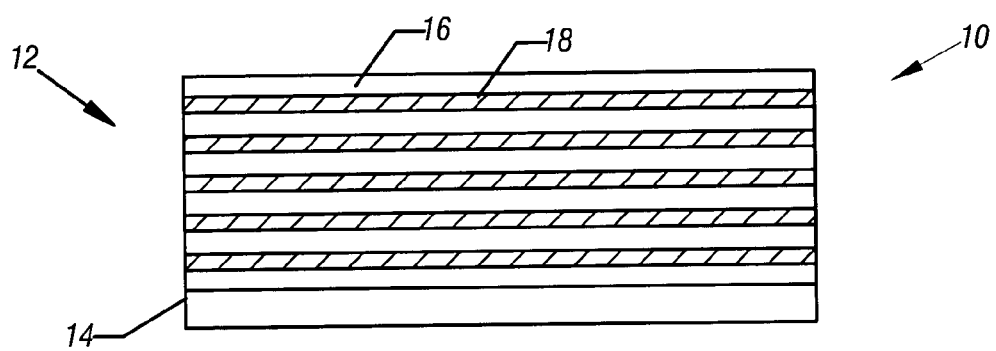
FIG. 1 is a cross-sectional view of one embodiment of the present invention.

Referring to FIG. 1, an extreme ultraviolet lithography multilayer blank may include a stack 12 made up of a plurality of pairs of molybdenum and silicon layers. In one embodiment, forty such pairs may be included. These pairs may be deposited one after the other. A substrate 14 may be provided underneath the stack 12. In some embodiments, apertures may be made through the stack 12 to define features to be transferred.

The reflectivity of the blank 10 may be locally modified by local heating. The heating pattern depends on the mask data design and the need for proximity correction. Once the mask design is known, the heating patterning and dose can be designed and provided to a heating tool. The heating tool can be, for example, an electron beam tool, an ion beam tool, or a laser. The heating pattern and dose may then be controlled by software in the heating tool, for example. In the case of electron beam heating, the heating pattern generation may be similar to that of standard resist electron beam writing.

Figure 2:
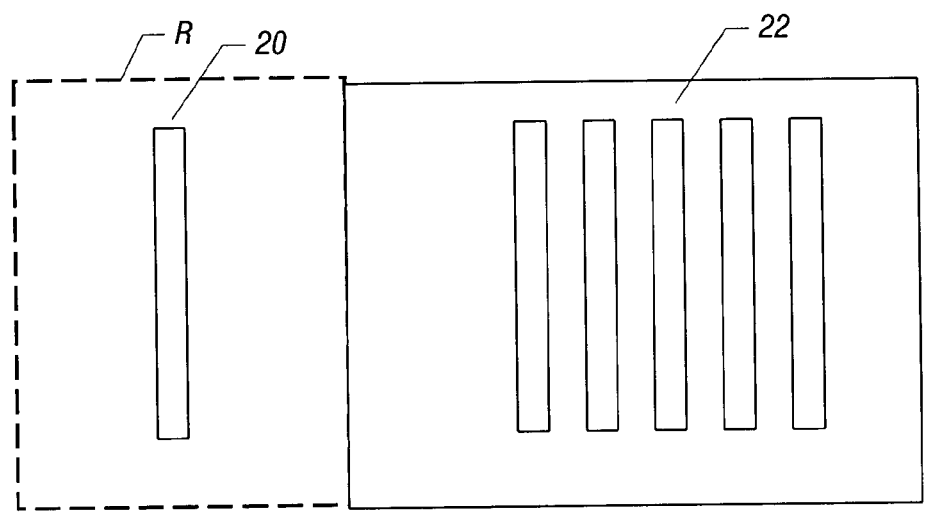
FIG. 2 is a top plan view of a schematic embodiment of the present invention.

Referring to FIG. 2, in a simple case, a first plurality of dense lines 22 with one spacing are juxtaposed across from an isolated line 20 with a different spacing. The isolated line 20 and the dense lines 22 are printed together. With a given exposure dose, the isolated line 20 may print smaller than the dense lines 22. This indicates that a lower dose is needed for the isolated line 20.

The modification of dose can be achieved by locally heating the dotted line region R in FIG. 2. By controlling the heat intensity, the desired reflectivity reduction can be achieved. Basically, the peak reflectivity is reduced and is shifted to shorter wavelengths in response to heating due to some silicide formation at the molybdenum and silicon interfacing layers in the stack 12. The reflectivity reduction at the exposure is achieved via both directly reducing the blank peak reflectivity and shifting the reflectivity spectrum away from the exposure wavelength.

After the blank reflectivity modification is done, the mask pattern may be aligned to the blank modified reflectivity region. The alignment requirement for general proximity correction can be relatively loose. Where more sophisticated pattern correction is involved, such as in line end shorting, the alignment may become more important.

The same concept of reflectivity correction can also be applied after the mask is patterned. In this case, alignment can be done by directly using the mask pattern.

Figure 4:
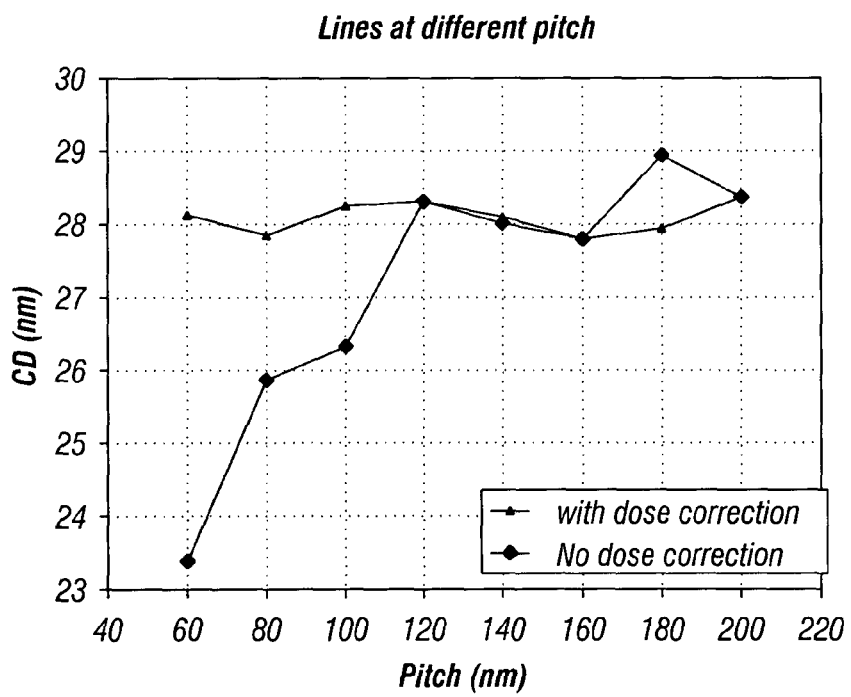
FIG. 4 is a simulation of critical dimensions in nanometers versus pitch in nanometers for lines at different pitch.

Referring to FIG. 4, simulation results show the printed line critical dimension on the wafer versus pitch with or without dose correction. The targeted line width is 27 nanometers. The reflectivity corrected mask in this case has four different reflectivity regions with corresponding dose ranges from a nominal −7.1%, −21.4%, and −42.8%, respectively.

Figure 3:
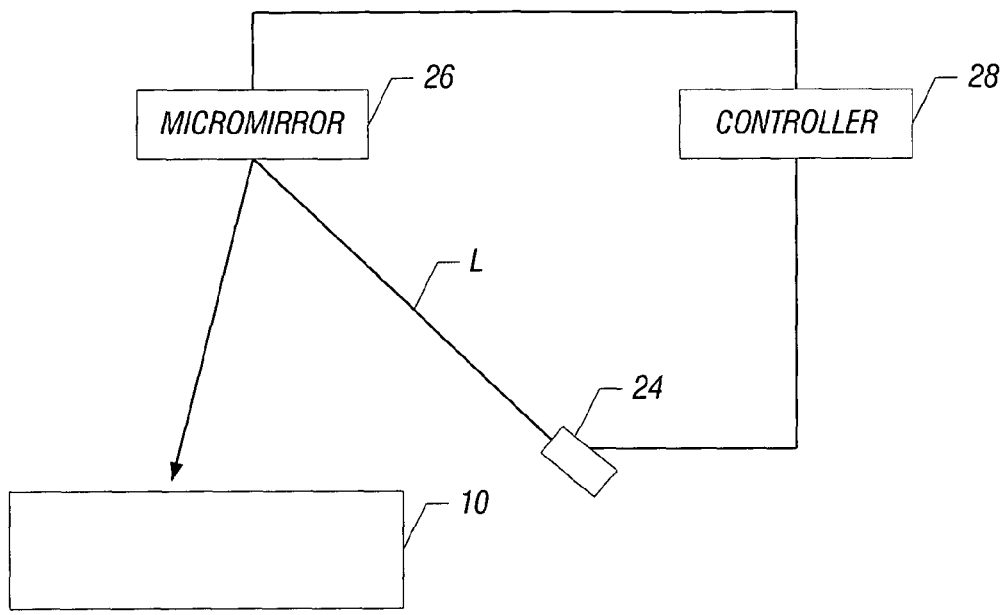
FIG. 3 is a schematic depiction of one embodiment of the present invention.

Referring to FIG. 3, in one embodiment of the present invention, the mask 10 may be exposed to localized heating from an irradiation source 24. The source 24 generates a beam L which is directed by a micromirror device 26 towards the mask 10 and, particularly, at the region desired to be corrected. A controller 28 may run software which controls the positioning of either or both of the micromirror 26 and the irradiation source 24 to direct the local heating as desired. The intensity of the irradiation source 24 may also be adjusted by the controller 28 to achieve the desired results.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   providing localized heating to a lithography mask made up of alternating layers of metal and silicon such that a metal silicide is formed to adjust for optical limitations in the mask formation process.

2. The method of claim 1 wherein providing localized heating to adjust for the proximity effect.

3. The method of claim 1 including providing localized heating to adjust for line end shortening.

4. The method of claim 1 wherein providing localized heating includes directing a laser beam to a localized region.

5. The method of claim 1 including providing localized heating to an extreme ultraviolet lithography mask.

6. A lithography mask comprising:
a substrate; and
a stack over said substrate, said stack including alternate layers of metal and silicon, a silicide formed between at least one of said layers of metal and silicon.

7. The mask of claim 6 wherein said mask is an extreme ultraviolet lithography mask.

8. The mask of claim 6 wherein said mask is modified in a localized region to correct line end shortening.

9. The mask of claim 6 wherein said mask is modified in a localized region to reduce the proximity effect.

10. An ultraviolet lithography mask comprising:
a substrate; and
a stack over said substrate, said stack including alternating layers of silicon and another material, and localized regions of silicide formed in a silicon layer.

11. The mask of claim 10 wherein said mask is modified in a localized region to correct line end shortening.

12. The mask of claim 10 wherein said mask is modified in a localized region to reduce the proximity effect.

* * * * *